US008736947B2

(12) United States Patent
Kwak et al.

(10) Patent No.: US 8,736,947 B2
(45) Date of Patent: May 27, 2014

(54) MATERIALS AND DEVICE STACK FOR MARKET VIABLE ELECTROCHROMIC DEVICES (75) Inventors: Byung-Sung Leo Kwak, Portland, OR (US); Kaushal K. Singh, Santa Clara, CA (US); Joseph G. Gordon, II, San Jose, CA (US); Omkaram Nalamasu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 13/501,994

(22) PCT Filed: Oct. 22, 2010

(86) PCT No.: PCT/US2010/053802
§ 371 (c)(1),
(2), (4) Date: Apr. 13, 2012

(87) PCT Pub. No.: WO2011/050291
PCT Pub. Date: Apr. 28, 2011

(65) Prior Publication Data
US 2012/0218621 A1 Aug. 30, 2012

Related U.S. Application Data (60) Provisional application No. 61/254,464, filed on Oct. 23, 2009.

(51) Int. Cl.
*G02F 1/153* (2006.01)
*G02F 1/15* (2006.01)
(52) U.S. Cl.
CPC ............. *G02F 1/1523* (2013.01); *Y10S 359/90* (2013.01)
USPC .......................................... 359/275; 359/900

(58) Field of Classification Search
USPC .......................................... 359/265–275, 900
See application file for complete search history.

(56) References Cited

U.S. PATENT DOCUMENTS 5,051,274 A   9/1991   Goldner et al.
5,178,739 A   1/1993   Barnes et al.
(Continued)

FOREIGN PATENT DOCUMENTS

EP          045240 A2   10/1991
EP          0454240 A2  10/1991
WO    WO2008/013499 A1   1/2008

OTHER PUBLICATIONS

International Search Report and Written Opinion for PCT/US2010/053802 issued Jul. 1, 2011.
(Continued)

*Primary Examiner* — Jack Dinh
(74) *Attorney, Agent, or Firm* — Pillsbury Winthrop Shaw Pittman LLP (57) ABSTRACT The present invention generally relates to electrochromic (EC) devices, such as used in electrochromic windows (ECWs), and their manufacture. The EC devices may comprise a transparent substrate; a first transparent conductive layer; a doped coloration layer, wherein the coloration layer dopants provide structural stability to the arrangement of atoms in the coloration layer; an electrolyte layer; a doped anode layer over said electrolyte layer, wherein the anode layer dopant provides increased electrically conductivity in the doped anode layer; and a second transparent conductive layer. A method of fabricating an electrochromic device may comprise depositing on a substrate, in sequence, a first transparent conductive layer, a doped coloration layer, an electrolyte layer, a doped anode layer, and a second transparent conductive layer, wherein at least one of the doped coloration layer, the electrolyte layer and the doped anode layer is sputter deposited using a combinatorial plasma deposition process.

15 Claims, 5 Drawing Sheets

(56) References Cited

U.S. PATENT DOCUMENTS

| | | | |
|---|---|---|---|
| 5,707,556 | A | 1/1998 | Babinec et al. |
| 5,925,227 | A | 7/1999 | Kobayashi |
| 6,235,169 | B1 | 5/2001 | Gopalraja et al. |
| 6,266,177 | B1 | 7/2001 | Allemand et al. |
| 6,506,289 | B2 | 1/2003 | Demaray et al. |
| 6,827,826 | B2 | 12/2004 | Demaray et al. |
| 7,099,062 | B2 | 8/2006 | Azens et al. |
| 7,247,221 | B2 | 7/2007 | Stowell, Jr. |
| 7,307,772 | B2 | 12/2007 | Garg et al. |
| 7,469,558 | B2 | 12/2008 | Demaray et al. |
| 2007/0139756 | A1 | 6/2007 | Agrawal et al. |
| 2008/0160298 | A1 | 7/2008 | Li et al. |
| 2009/0159433 | A1 | 6/2009 | Neudecker et al. |
| 2010/0101829 | A1 | 4/2010 | Verhaverbeke et al. |

OTHER PUBLICATIONS

Werbaneth, P. et al.; "The Reactive Ion Etching of Au on GaAs Substrates in a High Density Plasma Etch Reactor," The International Conference on Compound Semiconductor Manufacturing Technology, St Louis, 1999, 4 pages. Available at: http://gaasmantech.com/Digests/1999/PDF/12.pdf.

Avendano et al., "Electrochromism in nickel oxide films containing Mg Al, Si, V, Zr, Nb, Ag or Ta," Solar Energy Materials & Solar Cells 84 (2004) 337-350.

MATERIALS AND DEVICE STACK FOR MARKET VIABLE ELECTROCHROMIC DEVICES

CROSS-REFERENCE TO RELATED APPLICATIONS

This application claims the benefit of U.S. Provisional Application Ser. No. 61/254,464 filed Oct. 23, 2009, incorporated by reference in its entirety herein.

FIELD OF THE INVENTION

Embodiments of the present invention relate generally to electrochromic devices and methods of manufacture of said electrochromic devices.

BACKGROUND OF THE INVENTION

Windows provide natural light, fresh air, access and connection to the outside. However, they represent significant sources of wasted energy (heat loss in winter and solar heat gain in summer), which has been estimated to be about 5 Quads annually (i.e., 5% of total energy usage) in the US. With the growing architectural trend of increasing window area, the balancing of the conflicting interests between energy efficiency and aesthetics is becoming more critical.

Electrochromic windows (ECW), with dynamic control of pertinent optical properties to modulate solar radiation, promise significant reduction in energy use while improving human comfort factors. However, the current state-of-the-art ECW technologies are not market viable as they do not meet the requirements in cost, supply, available sizes and device performance. Device performance issues include appearance (e.g., defects), color selection (including matching non-ECW panes and baseline hue in "clear state" yellow), consistency (e.g., pane-to-pane, over long term production), switching speed and long term reliability (>25 yrs).

Thus, there is a need to develop ECWs that have appropriate color, switching speed and long term reliability.

SUMMARY OF THE INVENTION

The present invention generally relates to electrochromic (EC) devices, including ECWs, and their manufacture. The EC devices may be cathodically colored, anodically colored or a combination of both. The coloration may occur because of movement of an ion, such as lithium, between the cathode/coloration layer and the anode/counter electrode layer. It is to be understood that when the words "cathode layer" and "coloration layer" may be used interchangeably throughout the application. Additionally, it is to be understood that the words "anode layer" and "counter electrode layer" may be used interchangeably throughout the application.

In one embodiment, an EC device may comprise: a transparent substrate; a first transparent conductive layer; a doped coloration layer, wherein the coloration layer dopants provide structural stability to the arrangement of atoms in the coloration layer; an electrolyte layer; a doped anode layer over said electrolyte layer, wherein the anode layer dopant provides increased electrically conductivity in the doped anode layer; and a second transparent conductive layer.

In another, embodiment, a method of fabricating an electrochromic device may comprise depositing on a substrate, in sequence, a first transparent conductive layer, a doped coloration layer, an electrolyte layer, a doped anode layer, and a second transparent conductive layer, wherein at least one of the doped coloration layer, the electrolyte layer or the doped anode layer is sputter deposited using a combinatorial plasma deposition process. The combinatorial plasma deposition process includes applying different frequency power supplies to one or more of the substrate holder, sputtering target and plasma generated in the deposition chamber between the target and the substrate holder.

In another embodiment, an apparatus for forming electrochromic devices, comprises: a first system to deposit a first transparent conductive layer over a substrate; a second system to depositing a doped coloration layer over the first transparent conductive layer; a third system to deposit an electrolyte layer over the doped coloration layer; a fourth system to deposit a doped anode layer over the electrolyte layer; and a fifth system to deposit a second transparent conductive layer over the doped anode layer; wherein at least one of the doped coloration layer, the electrolyte layer and the doped anode layer is sputter deposited using a combinatorial plasma deposition system.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention generally relates to electrochromic devices and their manufacture. Electrochromic devices may be cathodically colored, anodically colored or a combination of both. The coloration may occur because of movement of an ion, such as lithium, between the cathode layer and the counter electrode layer.

Electrochromic device performance may be improved by (1) enhancement of structural stability, (2) bandgap engineering, and (3) enhancement of electrical conductivities. These concepts are used to create embodiments that address color, device switching speed, and long term reliability. The basic method to induce such changes is by doping the electrochromic device active materials with appropriate elements for each effect.

The color of the devices, both at clear and tinted states for example, can be affected by doping (e.g., substitution as solid solution) to both cathode and anode materials in the stack. For the tinted state, different bandgap structures may be created by adding metal. For example, various kinds of metals (i.e., alkali, alkaline earth, transition) may be used to create different light-material interactions as well as forming "color centers" unique to the substituting element.

One of the key issues for ECWs is the yellowish baseline color when the device is in the clear state. The root causes are thought to be (1) structural instability of metal oxide units ($WO_x$) with Li insertion/de-insertion cycles, leading to Jahn-Teller distortion and a corresponding shift in energy structure and color shift, (2) base color of $NiO_x$, the most frequently used base anode material, and (3) interference due to the grain boundaries. The first two suspected root causes can be addressed by doping with appropriate metals (alkali, alkaline, transition, e.g. Mg, Ca, Mo, W, V, etc., into the $NiO_x$ and/or $WO_x$) again to change the bandgap structure (hence the varied light-material interaction) and to create unique and desired color centers. Another method is to dope the $WO_x$ with an appropriate anion (e.g., halides) to enhance the $WO_x$ structural stability over Li cyclings.

The potential interference from grain structure can be mitigated by (1) controlling deposition process parameters to affect the grain structure, either with in situ (e.g., applying substrate bias and microwave enhancements or thermal energy) or post-deposition ex situ treatments (annealing) and/or (2) some interstitial (not substitutional) doping of elements that affect the grain structure. The mechanism for the second option can also be preferential migration of elements to the grain boundary to modulate the grain growth and the light-grain boundary interactions.

The transition speed of an electrochromic (EC) device is ultimately an issue of conductivity/resistivity, both ionic and electrical. The components that contribute to overall impedance are: spreading electrical resistance of the transparent conductive layer and ionic and electrical resistivities of the active material layers (cathode, anode and electrolyte). The innovations to reduce overall impedance of the device are (1) use of transparent conductive layers (TCL) with greater electrical conductivity without sacrificing the transparency, (2) metal substitution of parent oxides (cathode and anode) to induce increased electrical conductivity, and (3) use of a thinner electrolyte layer with higher ionic conductivity.

For the TCL, high temp, RF-DC sputtered ITO, carbon nanotube CNT layers, graphene layers, "magnetic metal" layers (see, for example, U.S. Patent Application Publication No. 2010/0101829) and other transparent, conductive materials may be considered. For the enhancement of electrical conductivities of the cathode and anode, metal substitution, used above for color enhancements, can be used, again with alkali, alkaline earth or transition metals of different valence states. For example, substituting Co with 5 to 10% of Mg in $LiCoO_2$ (i.e., $LiCo_{0.95}.Mg_{0.05}O_2$) leads to a conductivity increase of three orders of magnitude.

The transition speed is also affected by the ionic conduction (extrinsic property) of the electrolyte. Given an ionic conductivity (intrinsic property), the effect can be great if the electrolyte is prone to pinhole formation (i.e., non-conformal) and requires relatively thick layers to ensure internal electrical isolation between cathode and anode. This leads to higher ionic impedance between the two electrodes, and thus, to slower device switching speed. Thus, it is desirable to achieve electrical isolation with a relatively thin layer, which can be achieved (1) by using the already mentioned methods for modulating the grain structures of deposited layers and (2) by using surface mobility enhancement for better film conformality.

There are several levels of reliability, for example, device reliability against ambient exposure and device cycling reliability. The device cycling reliability may be enhanced by the use of more stable electrode materials (some disclosed above, $WO_x$+halide) and more robust and electrochemically stable electrolyte. Here, the lithium phosphorus oxynitride, electrochemically stable up to 5.5V, chemically stable against Li metal, and has demonstrated in excess of 100,000 cycle life in thin film batteries (electrochemical device), may be used.

Fundamentally, the electrochromic device dynamically changes optical absorbance, with the movement (intercalation and de-intercalation) of the Li into and out of the cathode, for cathodically coloring devices. This, in turn, modulates the interaction with solar radiation thereby modulating the solar heat gain coefficient (SHGC) for energy control, as well as visibility and glare (important for human comfort).

Figure 1:
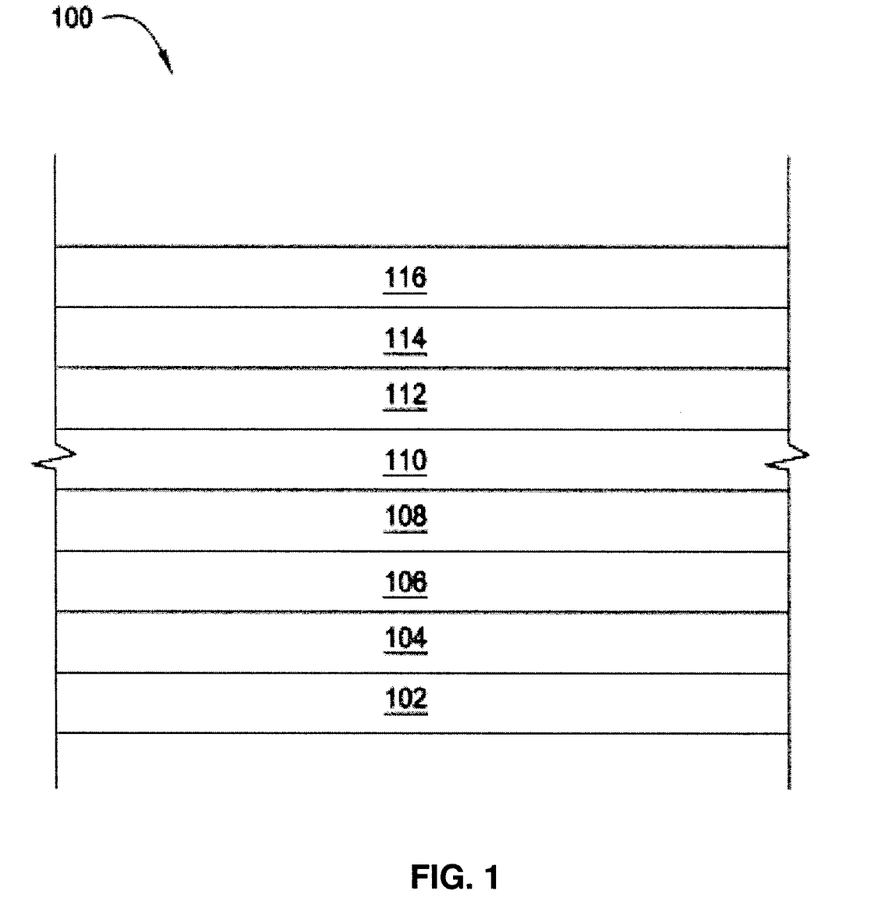
FIG. 1 is a schematic cross sectional view of an ECW according to one embodiment.

FIG. 1 is a schematic cross-sectional view of an ECW 100 according to one embodiment. The ECW 100 includes a substrate 102. In another embodiment, the substrate 102 may comprise glass. In another embodiment, the substrate 102 may comprise soda lime glass. In another embodiment, the substrate 102 may comprise plastic. In another embodiment, the substrate 102 may comprise polyimide. In another embodiment, the substrate 102 may comprise polyethylene terephthalate. In another embodiment, the substrate 102 may comprise polyethylene naphthalate. In another embodiment, the substrate 102 may comprise borosilicate glass. A typical (glass/rigid) substrate upon which the electrochromic device is fabricated is on the order of a millimeter thick (for a laminated EC device) or will have the thickness specified fro the final product (e.g. window) and a typical electrochromic device covers the fully exposed area of the architectural glass, or rear-view mirror, for example.

If the materials of the substrate 102 could contaminate the layers of the ECW, then a barrier layer 104 may be present. In one embodiment, the barrier layer 104 may comprise a silicon containing material. In another embodiment, the barrier layer 104 may comprise silicon nitride. In another embodiment, the barrier layer 104 may comprise silicon oxide. In another embodiment, the barrier layer 104 may comprise silicon dioxide. In another embodiment, the barrier layer 104 may comprise silicon oxynitride. In another embodiment, the barrier layer 104 may comprise multiple layers of materials. In another embodiment, the barrier layer 104 may comprise transparent metal oxides. In another embodiment, the barrier layer 104 may comprise transparent metal oxynitrides. In another embodiment, the barrier layer 104 may comprise graded layers. The barrier layer 104 may be deposited by well known deposition methods including physical vapor deposition (PVD), chemical vapor deposition (CVD), plasma enhanced chemical vapor deposition (PECVD), electron and ion beam evaporation and thermal evaporation, etc. For a PVD process, the process may be AC, DC, pulsed DC, RF, HF (e.g., microwave) and combinations thereof. The barrier layer 104 may be deposited to a thickness of approximately 0.05 to 1.0 micron.

Over the barrier layer 104, a transparent conductive coating 106 may be deposited. In one embodiment, the transparent conductive coating 106 may comprise a transparent conductive oxide. In another embodiment, the transparent conductive coating 106 may comprise indium tin oxide (ITO). In another embodiment, the transparent conductive coating 106 may comprise aluminum doped zinc oxide. In another embodiment, the transparent conductive coating 106 may comprise zinc oxide. In another embodiment, the transparent conductive coating 106 may comprise carbon-based materials, like CNTs and graphene. In another embodiment, the transparent conductive coating 106 may comprise multiple layers. In general, the transparent conductive coating 106 may include any highly conductive and highly transparent material. The transparent conductive coating 106 may be deposited by well known deposition methods including PVD, CVD, PECVD, electron and ion beam evaporation, thermal evaporation, etc. For a PVD process, the process may be AC, DC, pulsed DC, RF, HF (e.g., microwave), or combinations thereof. The transparent conductive coating 106 may be deposited to a thickness of approximately 0.1 to 1.0 micron.

Over the transparent conductive coating 106, a coloration layer 108 may be deposited. The coloration layer 108 may be referred to as a working electrode or cathode. In one embodiment, the coloration layer 108 comprises doped tungsten oxide. In another embodiment, the coloration layer 108 comprises $WO_3$. In another embodiment, the anode/counter electrode layer 112 may comprise of $WO_x$, where x is less than 3. Other materials that may be used in the coloration layer include $CrO_x$ and $MoO_x$. Stoichiometric $WO_3$ films are transparent for energies below the fundamental band gap of about 3 eV. Li ion intercalation leads to a broad absorption band centered at ~1.2 eV, which produces a distinctly blue color. In one embodiment, the tungsten oxide is doped with a halide for stability—with $WO_{3-x}Cl_x$ stoichiometry, where x is less than or equal to 1. In another embodiment, the tungsten oxide is doped with nitrogen for stability—with $WO_{3-x}N_x$ stoichiometry, where x is less than or equal to 1. In absence of a dopant, the coloration layer 108 may have a yellow appearance when the lithium moves to the anode/counter electrode 112 from the coloration layer 108 through the electrolyte layer 110. The reason that the tungsten oxide has a yellow appearance is because the tungsten oxide structure is not stable. Thus, when the lithium exits the coloration layer 108, the bandgap of the coloration layer 108 changes (via Jahn-Teller distortion) which gives off a yellowish hue. However, when a dopant is added, such as a halide, the tungsten oxide is more stable. In other words, the structure of 100 is stable when the lithium comes into and out of the doped coloration layer 108. In one embodiment, the dopant may comprise chlorine. In another embodiment, the dopant may comprise an alkali metal. In another embodiment, the dopant may comprise an alkaline earth metal. In another embodiment, the dopant may comprise magnesium. The dopant may be selected to achieve a desired electrical conductivity for the coloration layer 108. Additionally, the dopant may be chosen to provide a different coloration effect when the lithium moves into the coloration layer 108. Because the coloration layer 108 is colored when the lithium goes into the coloration layer 108, the process is referred to as cathodic coloring.

The coloration layer 108 may be deposited by well known deposition methods including PVD, CVD, PECVD, electron and ion beam evaporation, thermal evaporation, etc. For a PVD process, the process may be AC, DC, pulsed DC, RF, HF (e.g., microwave) or combinations thereof. The coloration layer 108 may be deposited to a thickness of approximately 0.1 to 1.0 micron. In one embodiment, the sputtering target may comprise the same material as the deposited layer and be performed by pulsed DC sputtering or RF sputtering in an argon or $Ar/O_2$, ambient environment. In another embodiment, the sputtering target may comprise a metal and be reactively sputtered in a reactive atmosphere.

Over the coloration layer 108, an electrolyte layer 110 may be deposited. The electrolyte layer 110 has electrochemical stability that helps the robustness of the elecrochromic device. The electrolyte layer 110 may be referred to as the ionic conductor layer. In one embodiment, the electrolyte layer 110 may comprise lithium phosphorous oxynitride. In another embodiment, the electrolyte layer 110 may comprise tantalum oxide. In another embodiment, the electrolyte layer 110 may comprise $Ta_2O_5$. The electrolyte layer 110 provides the path through which ions move into the coloration layer 108. The electrolyte layer 110 provides the necessary internal electrical isolation between the coloration layer 108 and the counter electrode 112. The electrolyte layer 110 may be deposited using an RF or high frequency deposition processes, as well as combination of the two. In another embodiment, the electrolyte layer 110 may be deposited using PECVD. In one embodiment, the electrolyte layer 110 may have a thickness of approximately 0.005 to 1.5 microns.

The electrolyte layer 110 may be deposited by a single or a multi-step sputtering process. In one embodiment, the electrolyte layer 110 may comprise $Li_xM_yO_z$ where M is a metal. The sputtering target may comprise the same material as the deposited layer and the sputtering process may be performed by pulsed DC sputtering or RF sputtering in an argon or $Ar/O_2$, ambient environment.

In another embodiment, the electrolyte layer 110 may comprise $Li_xM_yO_z$ where M is a metal and may be deposited by sputtering a $M_yO_z$ target using pulsed DC sputtering or RF sputtering in an argon/oxygen ambient atmosphere. Then, in a second step, a lithium target may be either sputtered in argon or evaporated in chamber baseline atmosphere. A multiple-frequency plasma source may be used—for example, RF superimposed upon DC sputtering to increase the plasma density and to reduce the sheath voltage. The issues associated with sputtering of Li metal are common to the alkali metals and alkaline earth metals and are described in more detail below.

Sputtering of alkali metals (such as Li, Na, K and Rb), and alkaline earth metals (such as Mg, Ca and Sr) are quite challenging because of their sensitivity to air ambient and due to their low melting temperatures, particularly those metals with lower atomic weight, such as Li, Na and Mg. Control of the sputtering process is a challenge, where the sputtering process must keep the metal below its melting temperature to ensure a stable process. In addition, the lower atomic weight elements such as Li and Na can suffer from irregular sputtering behaviors when typical noble gases of higher atomic weight, like Ar, are used as the sputtering agent. This irregular sputtering behavior may be "splattering" where the sputtering is not atom-by-atom, but "clusters of atoms" by "clusters of atoms." Such a situation will adversely affect the deposition uniformity and surface microstructure. To minimize the splattering effect, a lower deposition rate process may be used; however, this leads to adverse manufacturing conditions for throughput.

Some of the concepts of the present invention which address the Li deposition issues are: (1) use of lighter noble gases such as He and Ne and/or mixture of noble gases such as: He/Ne, He/Ar and Ne/Ar and (2) single and multiple power sources, which may include DC, pulsed DC, RF, RF-DC, pulsed DC-RF, pulsed DC-HF and/or other dual frequency power sources. The lighter noble gases will lead to more balanced momentum transfer to produce atom-by-atom sputtering while the mixtures may lead to improved sputtering rate. The multiple power sources can lead to better control of the sputtering environment (plasma density, sheet voltages, energetics of the plasma species, etc.) to enhance the sputtering behavior and deposition rates. The multiple frequency sources can allow de-convolution of the control of plasma characteristics (self bias, plasma density, ion and electron energies, etc.), so that the higher yielding conditions are reached at lower power than otherwise possible with a single power source. For example, a higher frequency power supply can be used to control ion density at the same time a lower frequency supply is used to control ion energy.

In another embodiment, the electrolyte layer 110 may comprise $Li_xM_yO_z$ where M is a metal and may be deposited by sputtering an M target in an argon/oxygen ambient atmosphere using either DC sputtering or pulsed DC sputtering. Thereafter, a lithium target may be evaporated in chamber baseline or sputtered in an argon environment. However, the lithium issues discussed above should be considered.

In another embodiment, the electrolyte layer 110 may comprise lithium phosphorous oxynitride formed by RF sputtering a $Li_3PO_4$ target in a nitrogen ambient atmosphere. In another embodiment, the electrolyte layer 110 may comprise $TaO_x$ formed by either pulsed DC sputtering or RF sputtering a $Ta_2O_5$ target in an argon atmosphere with oxygen added thereto. In another embodiment, the electrolyte layer 110 may comprise $TaO_x$ and be formed by DC or pulsed DC sputtering a tantalum target in an argon/oxygen atmosphere.

Since lithium phosphorous oxynitride (LiPON) is an electrically insulating material (>1E14 Ω-cm), traditional RF sputtering is typically used, which results in low deposition rates (≤1 μm/hr). Consequently, new deposition methods are needed. In one embodiment, the LiPON may be deposited by e-beam or ion beam evaporation.

In the case of RF sputtering, a multi-frequency based plasma deposition source in which higher frequency plasma is superposed with the RF power may be used to enhance the control of plasma density and ion energy. This may increase the deposition rates as well as induce energy impartation onto the growing film allowing modulation of growth kinetics. The result is desired conformity, morphology, crystallinity and pinhole density to yield better coating characteristics. In such a case, ion mobility on the film depositing surface may be increased allowing the use of thinner electrolyte that has lower impedance for faster switching speed. For evaporation, the temperature affects both the evaporation rate as well as the static deposition rate. In general, the higher the evaporation temperature, the higher both the evaporation rate and the static deposition rate. As discussed above, the LiPON may be deposited by e-beam or ion beam evaporation in one embodiment.

Over the electrolyte layer 110, an anode layer 112 may be deposited. The anode layer 112 may be referred to as a counter electrode. In one embodiment, the anode layer 112 may comprise nickel oxide. In another embodiment, the anode layer 112 may comprise $NiO_2$. In another embodiment, the anode/counter electrode layer 112 may comprise $NiO_x$, where x is less than 2. Other materials that may be used in a coloring anode include $IrO_x$ and $VO_x$. The lithium ion moves from the anode layer 110, through the electrolyte layer 110 to the coloration layer 108. Using additives such as Mg, Al, Si, Zr, Nb and Ta may be beneficial. Mg may be used, in a combinatorial fashion, to optimize its very beneficial effect in both Ni—O and Li—Ni—O systems where it widens the bandgap and improves the transmittance substantially. The inclusion of W into the Li—Ni—O may be used with a view to improving the stability of the counter electrode layer to UV radiation and moisture. With proper selection of material, the substitution can also increase the electrical conductivity (in some cases by 3 orders of magnitude, e.g., $LiCoO_2$ vs. $LiCo_{0.95}Mg_{0.05}O_2$). In addition, proper metal substitution may lead to anodic coloration, and thereby, enhance the difference in solar heat gain coefficient (SHGC) between the clear and tinted state to improve the intended energy savings. Note that combined beneficial effects, such as improved electrical conductivity and optical transmittance, for example, may be achieved by a single dopant species; although, more than one dopant species may be used.

The anode layer 112 may be deposited by well known deposition methods including PVD, CVD, PECVD, electron or ion beam evaporation, thermal evaporation, etc. For a PVD process, the process may be AC, DC, pulsed DC, RF, HF or a combination thereof. In one embodiment, the anode layer 112 may have a thickness of approximately 0.1 to 1.0 micron. In one embodiment, the sputtering target may comprise the same material as the deposited layer and be performed by pulsed DC sputtering or RF sputtering in an argon or $Ar/O_2$, ambient environment. In another embodiment, the sputtering target may comprise a metal and be reactively sputtered in a reactive atmosphere.

Over the anode layer 112, a second transparent conductive coating 114 may be deposited. In one embodiment, the second transparent conductive coating 114 may comprise a transparent conductive oxide. In another embodiment, the second transparent conductive coating 114 may comprise indium tin oxide. In another embodiment, the second transparent conductive coating 114 may comprise aluminum doped zinc oxide. In another embodiment, the second transparent conductive coating 114 may comprise zinc oxide. In general, the second transparent conductive coating 114 may include any highly conductive and highly transparent material. The second transparent conductive coating 114 may be deposited by well known deposition methods including PVD, CVD, PECVD, electron or ion beam evaporation, thermal evaporation, etc. For a PVD process, the process may be AC, DC, pulsed DC, RF, HF or a combination thereof. The second transparent conductive coating 114 may be deposited to a thickness of approximately 0.1 to 1.0 micron.

Over the second transparent conductive coating 114, a capping layer 116 may be deposited. In one embodiment, the capping layer 116 comprises a barrier layer. In another embodiment, the capping layer 116 comprises an anti-reflective coating. In another embodiment, the capping layer 116 comprises a color matching layer. Generally, the capping layer 116 is for reliability purposes so that ambient oxygen, $H_2O$, $CO_2$, etc. will not penetrate into the electrochromic device and affect the device performance. In one embodiment, the capping layer 116 may comprise a silicon containing material. In another embodiment, the capping layer 116 may comprise silicon nitride. In another embodiment, the capping layer 116 may comprise silicon oxide. In another embodiment, the capping layer 116 may comprise silicon dioxide. In another embodiment, the capping layer 116 may comprise silicon oxynitride. In another embodiment, the capping layer 116 may comprise transparent metal oxides. In another embodiment, the capping layer 116 may comprise transparent metal oxynitrides. In another embodiment, the capping layer 116 may comprise graded layers. In another embodiment, the capping layer 116 may comprise multiple layers of materials. Additionally, the capping layer 116 may comprise multiple layers and function as a barrier. The capping layer 116 may be deposited by well known deposition methods including PVD, CVD, PECVD, electron or ion beam evaporation, thermal evaporation, etc. For a PVD process, the process may be AC, DC, pulsed DC, RF, HF or a combination thereof. The second transparent capping layer 116 may be deposited to a thickness of approximately 0.1 to 1.0 micron.

Figure 2:
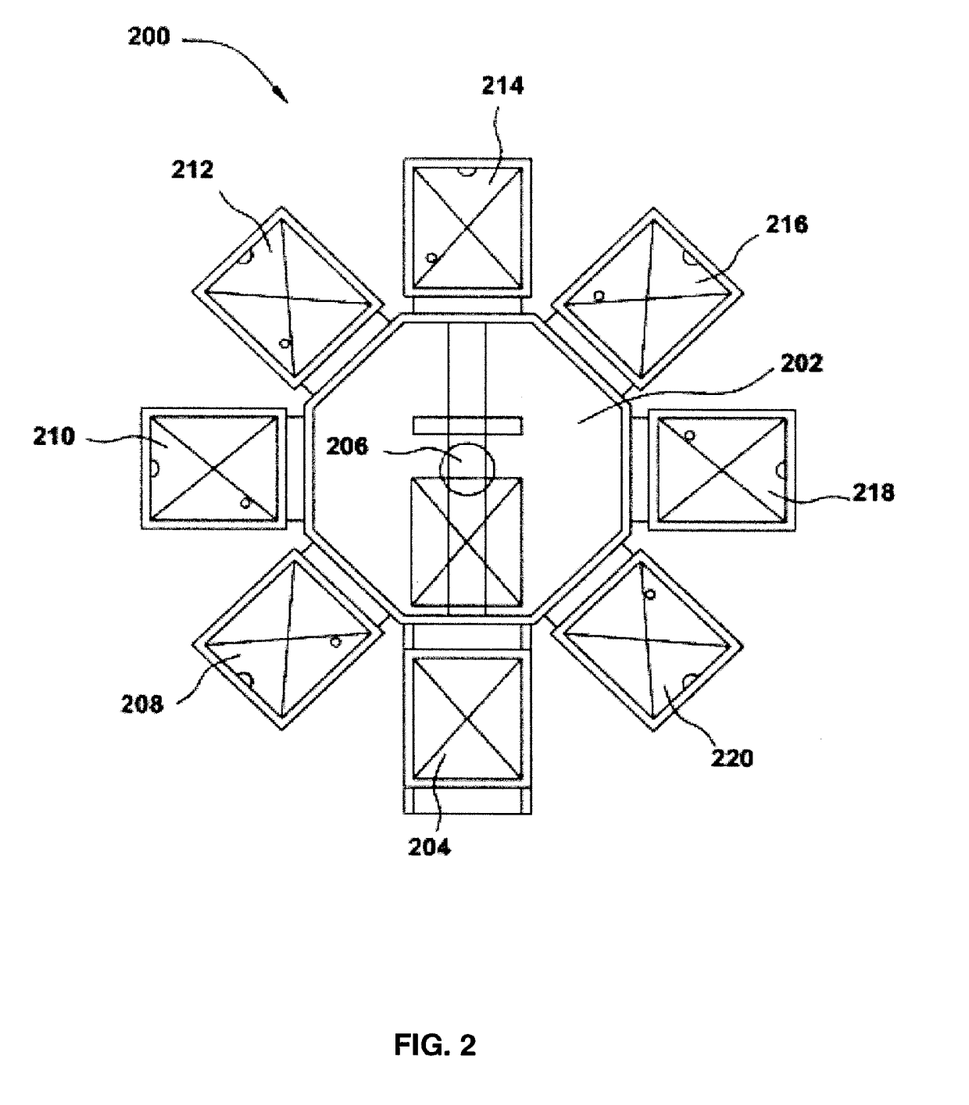
FIG. 2 is a schematic illustration of a processing system for fabricating an ECW.

FIG. 2 is a schematic illustration of a processing system 200 for fabricating an ECW according to one embodiment. The processing system 200 includes a central transfer chamber 202 that, in the embodiment shown in FIG. 2, may have eight sides to accommodate 8 chambers attached thereto. One of the chambers may include a load lock chamber 204 for introducing and removing substrates from the processing system 200. A robot 206 centrally located within the transfer chamber 202 may be used to transfer a substrate between chambers. One processing chamber 208 may be utilized for depositing a barrier layer over the substrate. A second processing chamber 210 may be used for fabrication of the transparent conductive coating layer over the barrier layer. A third processing chamber 212 may be used for fabrication of the coloration layer over the transparent conductive coating layer. A fourth processing chamber 214 may be used for fabrication of the electrolyte layer over the coloration layer. A fifth processing chamber 216 may be used to fabricate the anode layer over the electrolyte layer. A sixth processing chamber 218 may be used to fabricate the second transparent conductive coating over the anode layer. A seventh processing chamber 220 may be used to fabricate the capping or barrier layer over the ECW structure. Example of suitable cluster tool platforms include AKT's display cluster tools, such as the Generation 10 display cluster tools. It is to be understood that while a cluster arrangement has been shown for the processing system 200, a linear system may be utilized in which the processing chambers are arranged in a line without a transfer chamber so that the substrate continuously moves from one chamber to the next chamber.

Figure 3:
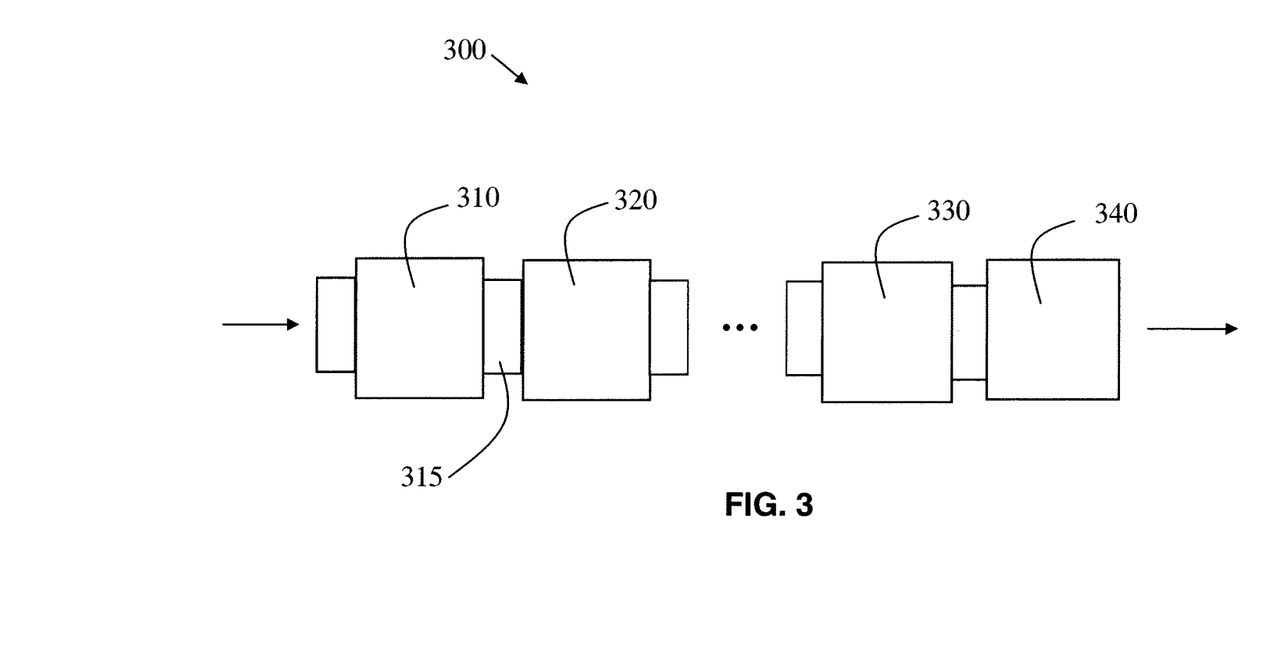
FIG. 3 is a representation of an electrochromic device fabrication system with multiple in-line tools, according to some embodiments of the present invention.

FIG. 3 shows a representation of an in-line fabrication system 300 with multiple in-line tools 310, 320, 330, 340, etc., according to some embodiments of the present invention. In-line tools may include tools for depositing all the layers of an electrochromic device. Furthermore, the in-line tools may include pre- and post-conditioning chambers. For example, tool 310 may be a pump down chamber for establishing a vacuum prior to the substrate moving through a vacuum airlock 315 into a deposition tool 320. Some or all of the in-line tools may be vacuum tools separated by vacuum airlocks 315. Note that the order of process tools and specific process tools in the process line will be determined by the particular electrochromic device fabrication method being used. Furthermore, substrates may be moved through the in-line fabrication system oriented either horizontally or vertically.

Figure 4:
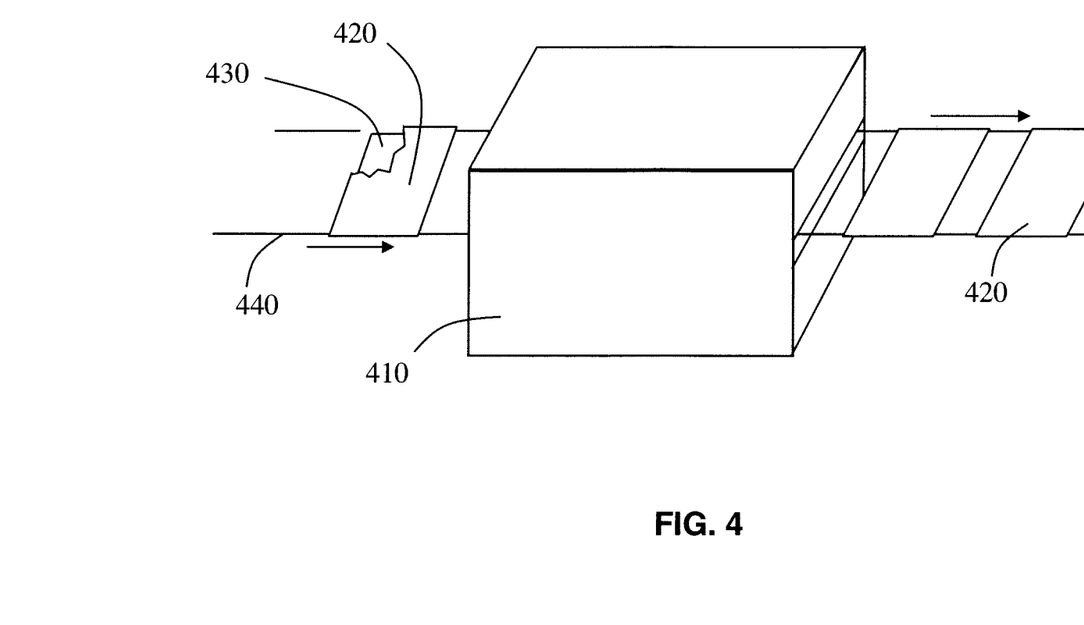
FIG. 4 is a representation of an in-line deposition tool, according to some embodiments of the present invention.

In order to illustrate the movement of a substrate through an in-line fabrication system such as shown in FIG. 3, in FIG. 4 a substrate conveyer 440 is shown with only one in-line tool 410 in place. A substrate holder 420 containing a large area substrate 430 (the substrate holder is shown partially cutaway so that the substrate can be seen) is mounted on the conveyer 440, or equivalent device, for moving the holder and substrate through the in-line tool 410, as indicated. Suitable in-line platforms for processing tool 410 are Applied Material's Aton™ and New Aristo™.

Figure 5:
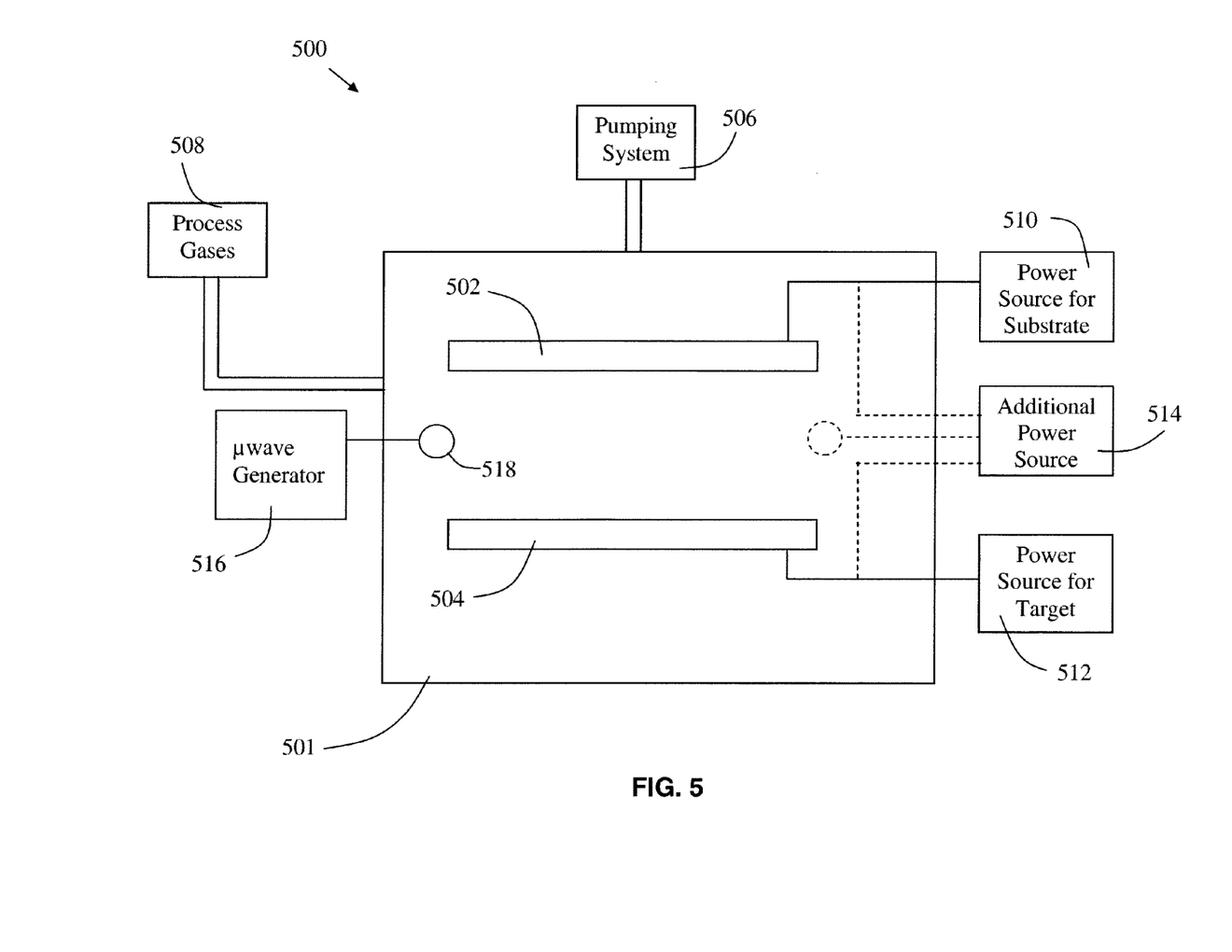
FIG. 5 is a schematic block diagram of an example combinatorial plasma deposition chamber, according to some embodiments of the present invention.

FIG. 5 shows an example of a combinatorial plasma deposition tool 500 which may be used for deposition of the barrier layer, first transparent conductive coating, coloration layer, electrolyte layer, alkali metal or alkaline earth metal, anode, second transparent conductive coating and/or capping layer, according to some embodiments of the invention. The system includes a chamber 501 housing a sputter target 504 and a substrate holder 502 for holding a substrate. Pumping system 506 is connected to chamber 501 for controlling a pressure therein, and process gases 508 represents sources of gases supplied to chamber 501 used in the deposition process. According to aspects of the invention, combinatorial plasma is achieved by coupling appropriate plasma power sources 510 and 512 to both the substrate (in the substrate holder 502) and target 504. An additional power source 514 may also be applied to the target 504, or the substrate or be used for transferring energy directly to the plasma, depending on the type of plasma deposition technique. Furthermore, a microwave generator 516 may provide microwave energy to a plasma within the chamber through the antenna 518. Microwave energy may be provided to the plasma in many other ways, as is known to those skilled in the art. The schematic is not meant to define orientation of the chamber with respect to gravity, i.e., the chamber may be oriented such that sputtering may be down, up or sideways, for example. Furthermore, the chamber of FIG. 5 may be configured for use in either an in-line or cluster tool fabrication system.

Depending on the type of plasma deposition technique used, substrate power source 510 can be a DC source, a pulsed DC (pDC) source, a RF source, etc. Target power source 512 can be DC, pDC, RF, etc., and any combination thereof. Additional power source 514 can be pDC, RF, microwave, a remote plasma source, etc.

Although the above provides the range of possible power sources, some specific examples of combinations of power source to target 504 plus power source to substrate for alkali metal/alkaline earth metal deposition are: (1) DC, pDC or RF at the target 504 plus HF or microwave plasma enhancement; (2) DC, pDC or RF at the target plus HF/RF substrate bias; and (3) DC, pDC or RF at the target 504 plus HF or microwave plasma plus HF/RF substrate bias. The nomenclature HF/RF is used to indicate the potential need for power sources of two different frequencies, where the frequencies are sufficiently different to avoid any interference. Although, the frequencies of the RF at the target 504 and at the substrate may be the same providing they are locked in phase. Furthermore, the substrate itself can be biased to modulate the plasma-substrate interactions. In particular, multiple frequency sources can allow de-convolution of the control of plasma characteristics (self bias, plasma density, ion and electron energies, etc.), so that the high yielding conditions are reached at lower power than otherwise possible with single power source.

Furthermore, the planar substrate and target in FIG. 5 are configured parallel to each other. This parallel configuration allows the deposition system to be scaled for any size of planar substrate while maintaining the same deposition characteristics. Note, as discussed above, that the size of the substrate and the target are roughly matched, with the target area (cluster tool) or width (in-line tool) being larger than that of the substrate so as to avoid target edge effects in the deposition uniformity on the substrates.

In general, embodiments of this invention provide high deposition rate sources and systems for deposition of a variety of EC layers, including alkali metals and alkaline earth metals, which can be adapted to any chamber form factor and are scalable for any size of substrate. These systems may be configured to make use of: (1) lighter noble gases and/or a mixture of noble gases; and (2) single and multiple power sources, e.g., DC, pulsed DC, RF, RF-DC, pulsed DC-RF, pulsed DC-HF and/or other dual frequency power sources.

The multiple frequency sources can allow de-convolution of the control of plasma characteristics (self bias, plasma density, ion and electron energies, etc.), so that the higher yielding conditions are reached at a lower power than is otherwise possible with a single power source. For example, a higher frequency power supply can be used to control ion density at the same time a lower frequency supply is used to control ion energy. Yet furthermore, these systems may be configured with a planar substrate parallel to a planar sputter target, the sputter target having a larger surface area (for cluster tool configurations) or larger width (for in-line configurations) than the substrate, thus providing a system which is capable of uniform deposition and scalable to accommodate any shape and size of planar substrate. The targets can also be a cylindrical or annular shape that rotates for high materials utilization applications.

According to further aspects of the invention, a method of sputter depositing a thin film on a substrate, wherein the thin film may be an alkali metal or an alkaline earth metal, comprises: igniting a plasma between the substrate and a metal sputter target, wherein the plasma includes noble gas species; adding energy to the plasma; sputtering alkali metal from the sputter target, wherein the sputtering is by noble gas species from the plasma; and depositing the sputtered alkali metal on the substrate. The adding energy may include one or more of adding RF-DC, pulsed DC-RF, pulsed DC-HF and/or other dual frequency power sources.

The apparatus of FIGS. 2 and 3 may be used to fabricate electrochromic devices according to the process flow provided above. For example, in a first system, such as 208 or 310, a first transparent conductive layer is deposited over a substrate. In a second system, a doped coloration layer is deposited over the first transparent conductive layer. In a third system, an electrolyte layer is deposited over the doped coloration layer. In a fourth system, a doped anode layer is deposited over the electrolyte layer. In a fifth system a second transparent conductive layer is deposited over the doped anode layer. One or more of the doped coloration layer, the electrolyte layer and/or the doped anode layer may be sputter deposited using a combinatorial plasma deposition process, such as described above with reference to FIG. 5. Further systems may be used for deposition of other device layers, as described above, such as a barrier layer and/or a capping layer.

Although the present invention has been particularly described with reference to certain embodiments thereof, it should be readily apparent to those of ordinary skill in the art that changes and modifications in the form and details may be made without departing from the spirit and scope of the invention.

The invention claimed is:

1. A method of fabricating an electrochromic device, comprising:
   depositing a first transparent conductive layer over a substrate;
   depositing a doped coloration layer over said first transparent conductive layer;
   depositing an electrolyte layer over said doped coloration layer;
   depositing a doped anode layer over said electrolyte layer; and
   depositing a second transparent conductive layer over said doped anode layer;
   wherein at least one of said doped coloration layer, said electrolyte layer and said doped anode layer is sputter deposited using a combinatorial plasma deposition process.

2. The method of claim 1, wherein said combinatorial plasma deposition process includes applying different frequency power to a sputter target and a substrate holder in a deposition chamber.

3. The method of claim 1, wherein said combinatorial plasma deposition process includes applying different frequency power to a sputter target and a plasma generated in a deposition chamber.

4. The method of claim 1, wherein said combinatorial plasma deposition process includes applying different frequency power to a substrate holder and a plasma generated in a deposition chamber.

5. The method of claim 1, wherein said combinatorial plasma deposition process includes applying different frequency power to a substrate holder, a sputter target and a plasma generated in a deposition chamber.

6. The method of claim 1, wherein said coloration layer comprises doped tungsten oxide.

7. The method of claim 1, wherein the electrolyte layer is selected from the group consisting of lithium phosphorous oxynitride, tantalum oxide, and combinations thereof.

8. The method of claim 1, wherein said electrolyte layer is deposited by a process including:
   sputtering a metal oxide target; and
   sputtering lithium metal using said combinatorial plasma deposition process.

9. The method of claim 8, wherein said combinatorial deposition process includes applying to said lithium metal a frequency selected from the group consisting of DC, pulsed DC and RF.

10. The method of claim 9, wherein said combinatorial deposition process further includes applying microwave energy to a plasma generated in a deposition chamber between said lithium metal and said substrate.

11. The method of claim 1, wherein said doped anode layer comprises doped nickel oxide.

12. An apparatus for forming an electrochromic device comprising:
   a first system to deposit a first transparent conductive layer over a substrate;
   a second system to depositing a doped coloration layer over said first transparent conductive layer;
   a third system to deposit an electrolyte layer over said doped coloration layer;
   a fourth system to deposit a doped anode layer over said electrolyte layer; and
   a fifth system to deposit a second transparent conductive layer over said doped anode layer;
   wherein at least one of said doped coloration layer, said electrolyte layer and said doped anode layer is sputter deposited using a combinatorial plasma deposition system.

13. An electrochromic device, comprising:
   a transparent substrate;
   a first transparent conductive layer over said transparent substrate;
   a doped coloration layer over said first transparent conductive layer, wherein the coloration layer dopant provides structural stability to the arrangement of atoms in said doped coloration layer;
   an electrolyte layer over said doped coloration layer;
   a doped anode layer over said electrolyte layer, wherein the anode layer dopant provides increased electrically conductivity in said doped anode layer; and
   a second transparent conductive layer over said doped anode layer.

14. The electrochromic device of claim 13, wherein said doped coloration layer comprises tungsten oxide doped with a halide.

15. The electrochromic device of claim 13, wherein the anode layer dopant affects the color properties of said doped anode layer.

* * * * *

UNITED STATES PATENT AND TRADEMARK OFFICE
CERTIFICATE OF CORRECTION

PATENT NO. : 8,736,947 B2  
APPLICATION NO. : 13/501994  
DATED : May 27, 2014  
INVENTOR(S) : Kwak et al.

Page 1 of 1

It is certified that error appears in the above-identified patent and that said Letters Patent is hereby corrected as shown below:

In the Specification:

In Column 1, Line 63, delete "another," and insert -- another --, therefor.

In Column 4, Line 46, delete "fro the" and insert -- for the --, therefor.

In Column 6, Line 13, delete "elecrochromic" and insert -- electrochromic --, therefor.

In Column 7, Line 66, delete "anode layer 110," and insert -- anode layer 112, --, therefor.

Signed and Sealed this  
Second Day of September, 2014

Michelle K. Lee  
*Deputy Director of the United States Patent and Trademark Office*